United States Patent
Plaine et al.

(10) Patent No.: US 7,335,922 B2
(45) Date of Patent: Feb. 26, 2008

(54) RADIATION-EMITTING-AND-RECEIVING SEMICONDUCTOR CHIP AND METHOD FOR PRODUCING SUCH A SEMICONDUCTOR CHIP

(75) Inventors: Glenn-Yves Plaine, Regensburg (DE); Tony Albrecht, Bad Abbach (DE); Peter Brick, Regensburg (DE); Marc Philippens, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/951,525

(22) Filed: Sep. 28, 2004

(65) Prior Publication Data

US 2005/0110026 A1    May 26, 2005

(30) Foreign Application Priority Data

Sep. 30, 2003    (DE) ............... 103 45 555

(51) Int. Cl.
*H01L 27/15*    (2006.01)

(52) U.S. Cl. ............... 257/80; 257/82; 257/E33.056; 257/E33.057; 257/E33.058; 257/E33.059; 257/E25.032

(58) Field of Classification Search ............... 257/80, 257/82, E33.056, E33.057, E33.058, E33.059, 257/E33.032
See application file for complete search history.

(56) References Cited

U.S. PATENT DOCUMENTS 5,144,637 A * 9/1992 Koch et al. ............... 372/50.21
5,283,447 A   2/1994 Olbright et al.
5,361,273 A * 11/1994 Kosaka ............... 372/50.23

(Continued)

FOREIGN PATENT DOCUMENTS

EP    0 532 025 A1    3/1993

(Continued)

OTHER PUBLICATIONS

Kosaka et al., "Pixels Consisting of a Single Vertical-Cavity Laser Thyristor and a Double Vertical-Cavity Phototransistor", 1993 IEEE, pp. 1409-1411.

(Continued)

*Primary Examiner*—Lynne Gurley
*Assistant Examiner*—Samuel A Gebremariam
(74) *Attorney, Agent, or Firm*—Cohen Pontani Lieberman & Pavane LLP

(57) ABSTRACT

A radiation-emitting-and-receiving semiconductor component has at least a first semiconductor layer construction (1) for emitting radiation and a second semiconductor layer construction (2) for receiving radiation, which are arranged in a manner spaced apart from one another on a common substrate (3) and have at least one first contact layer (4). The first semiconductor layer construction (1) has an electromagnetic-radiation-generating region (5) arranged between p-conducting semiconductor layers (6) and n-conducting semiconductor layers (7) of the first semiconductor layer construction (1). A second contact layer (8) is at least partially arranged on that surface of the first semiconductor layer construction (1) which is remote from the substrate (3) and that of the second semiconductor layer construction (2). The second semiconductor layer construction (2) has an electromagnetic-radiation-absorbing region (9), the composition of the radiation-generating region (5) being different from that of the radiation-absorbing region (9).

38 Claims, 6 Drawing Sheets

U.S. PATENT DOCUMENTS

| | | | |
|---|---|---|---|
| 5,404,373 A * | 4/1995 | Cheng | 372/50.124 |
| 5,914,976 A * | 6/1999 | Jayaraman et al. | 372/50.21 |
| 5,978,401 A | 11/1999 | Morgan | |
| 6,001,664 A | 12/1999 | Swirhun et al. | |
| 6,148,016 A | 11/2000 | Hegblom et al. | |
| 7,053,415 B2 * | 5/2006 | Swirhun et al. | 257/82 |
| 7,075,124 B2 | 7/2006 | Albrecht et al. | |
| 2003/0155625 A1 | 8/2003 | Kato et al. | |

FOREIGN PATENT DOCUMENTS

| EP | 0 627 770 A1 | 12/1994 |
|---|---|---|
| GB | 2 326 760 A | 12/1998 |

OTHER PUBLICATIONS

Ping Zhou et al., "Surface-emitting laser-based optical bistable switching device", Applied Physics Letters, American Institute of Physics, New York, vol. 59, No. 21, Nov. 18, 1991, pp. 2648-2650.

P. Zhou et al., "Cascadable, Latching Photonic Switch with High Optical Gain by the Monolithic Integration of a Vertical-Cavity Surface-Emitting Laser and a pn-pn Photothyristor", IEEE Transactions Photonics Technology Letters, vol. 3, No. 11, pp. 1009-1012, Nov. 1991.

* cited by examiner

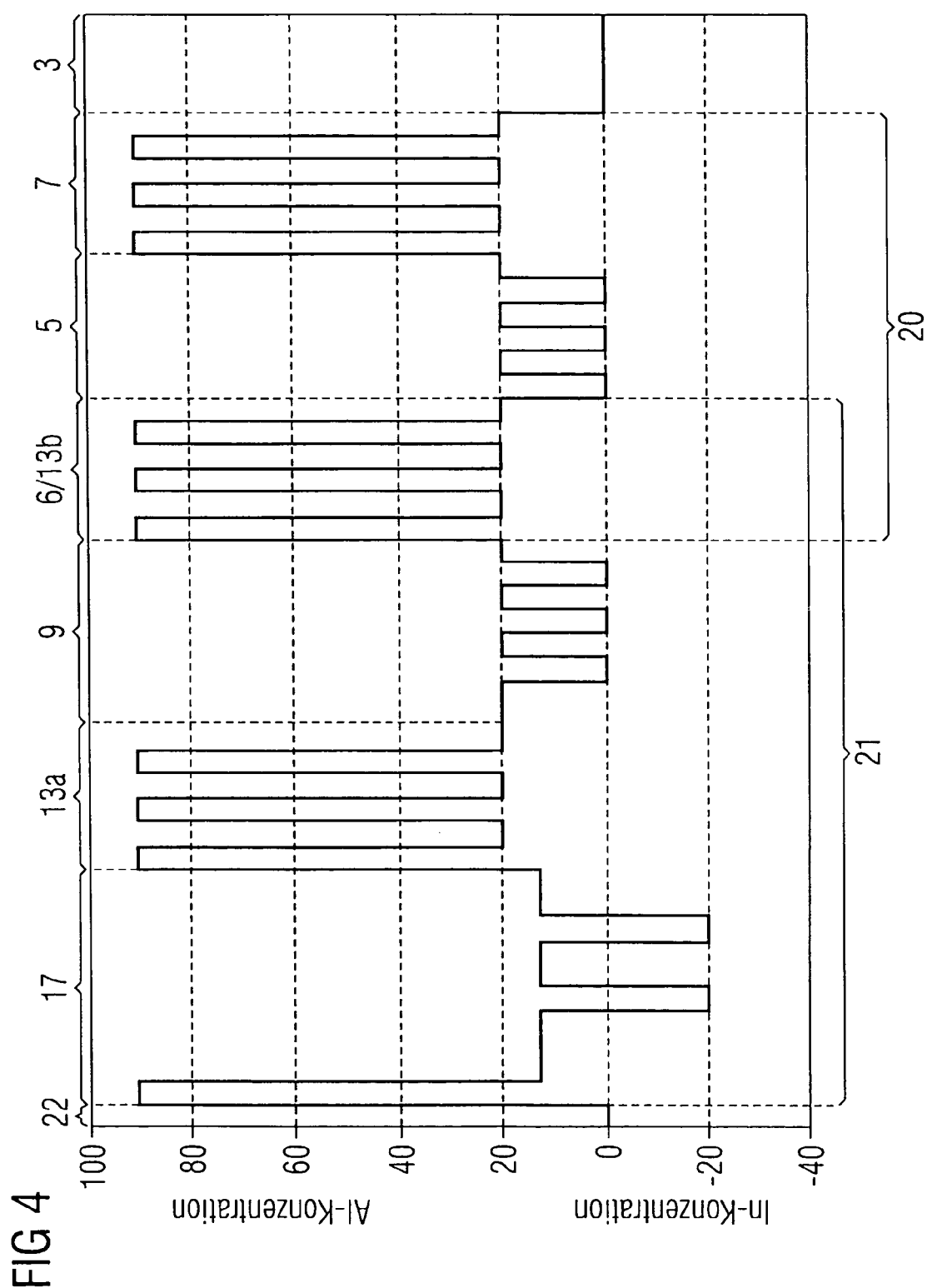

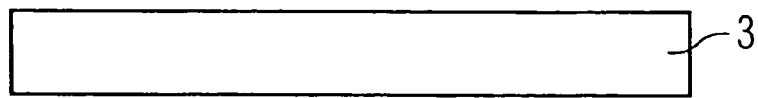
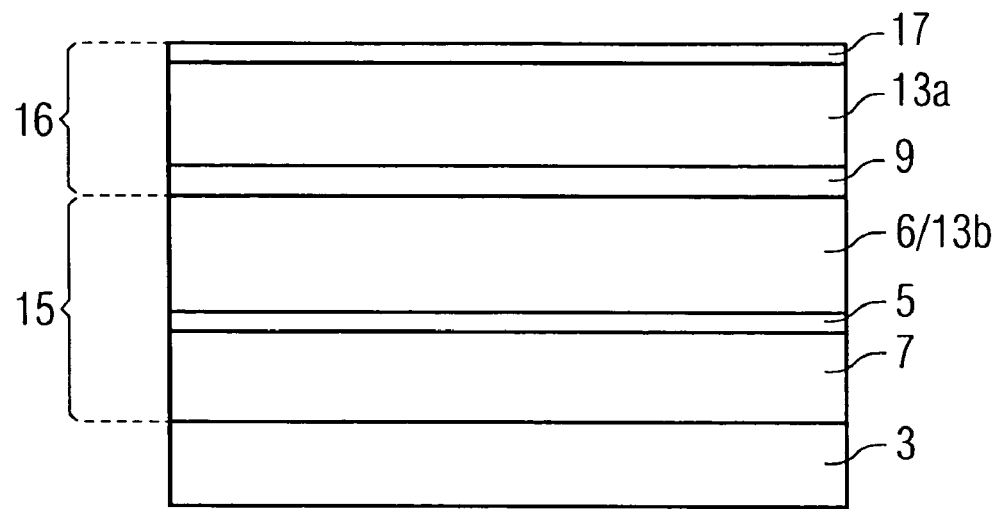
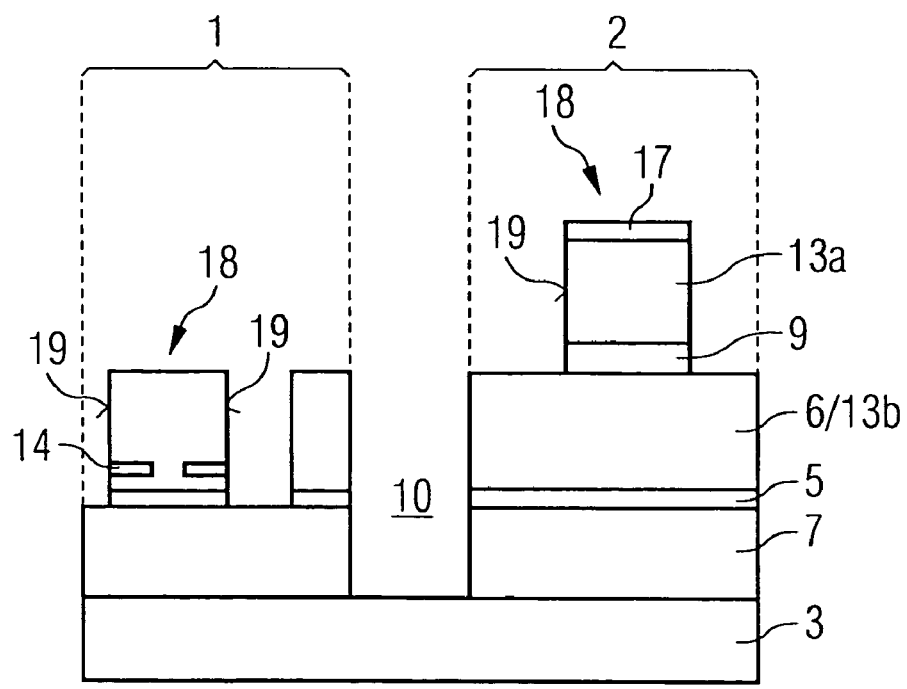

RADIATION-EMITTING-AND-RECEIVING SEMICONDUCTOR CHIP AND METHOD FOR PRODUCING SUCH A SEMICONDUCTOR CHIP

RELATED APPLICATIONS

This patent application claims the priority of German Patent Application 10345555.8-33 filed Sep. 30, 2004, the disclosure content of which is hereby incorporated by reference.

FIELD OF THE INVENTION

This invention relates to a radiation-emitting- and-receiving semiconductor component having at least a first semiconductor layer construction and a second semiconductor layer construction which are arranged spaced apart from one another in an integrated manner on a common substrate.

BACKGROUND OF THE INVENTION

Semiconductor components of the type mentioned in the introduction are disclosed for example in U.S. Pat. No. 5,978,401 and Kosaka et al., *"Pixels Consisting of a Single Vertical-Cavity Laser Thyristor and a Double Vertical-Cavity Phototransistor"*, 1993 IEEE 1409-1411. The construction of the semiconductor layers for the radiation-emitting-and-receiving part of the semiconductor component described hereinbelow is essentially identical in that case.

In optical sensor technology applications with changing ambient light or with different light sources, emitter and receiver usually lie spatially close together. For such applications, it is desirable to mount different components (e.g. optics, lens filters, amplifiers) beside the emitter and receiver in a very confined space. Often, the emitter, receiver and other components are in each case constructed one beside the other as separate components in separate constructional forms, adjusted with respect to one another and driven separately.

SUMMARY OF THE INVENTION

One object of the present invention is to provide a radiation-emitting-and- receiving, spatially compact semiconductor component of the type mentioned in the introduction in which the radiation-emitting-and-receiving components are coordinated with one another as well as possible.

Another object of the present invention is to provide a method for producing such semiconductor components with the least possible technical effort.

This and other objects are attained in accordance with one aspect of the invention directed to a radiation-emitting-and-receiving semiconductor component having at least a first semiconductor layer construction and a second semiconductor layer construction which are arranged spaced apart from one another in an integrated manner, preferably in a monolithically integrated manner, on a common substrate. The first semiconductor layer construction contains an electromagnetic-radiation-generating region arranged between a stack of p-conducting semiconductor layers and a stack of n-conducting semiconductor layers of the first semiconductor layer construction. The second semiconductor layer construction comprises an electromagnetic-radiation-absorbing region.

In an advantageous manner, the radiation-generating region has a composition which is different from that of the radiation-absorbing region. As a result, the radiation-absorbing region can absorb radiation in a wider wavelength range than the wavelength range of the radiation emitted by the radiation-generating region. A wider wavelength range for the absorption has the advantage, particularly in the case of narrowband receivers, that even radiation from the radiation-generating region that is incident obliquely (i.e. not perpendicularly) on the receiver can be detected.

If the semiconductor layers surrounding the radiation-absorbing region are formed as Bragg mirrors, it can happen that obliquely incident radiation whose wavelength falls within the absorption range to be detected does not reach the radiation-absorbing region due to interference effects of the Bragg mirrors. In comparison therewith, a radiation-absorbing region having the same composition as the radiation-generating region generally principally absorbs radiation from the radiation-generating region that impinges perpendicularly on the absorbing region. Therefore, there is the risk that the receiver of such a semiconductor component does not absorb a considerable part of the radiation emitted by the emitter. The receiver and emitter are thus not optimally coordinated with one another.

The receiver and emitter are well coordinated with one another if the receiver can detect all or at least a greatest possible proportion of the radiation from the emitter under the given conditions.

The different composition of the radiation-generating region and of the radiation-absorbing region results in a greater leeway for the configuration of the sensitivity of the receiver. The receiver can be coordinated more precisely with the radiation range of the emitter. In an advantageous manner, it is possible additionally to better compensate for unfavourable ambient conditions which influence the radiation emitted by the emitter or the coupling-in of this radiation in the receiver (e.g. as already described above with the obliquely incident radiation).

In a preferred embodiment, the first semiconductor layer construction is isolated from the second semiconductor layer construction by means of an electrically insulating region or a recess. The electrically insulating region or the recess extends at least through the radiation-generating region, but preferably as far as the substrate.

In a further embodiment, the first semiconductor layer construction has a first semiconductor layer sequence, which contains the radiation-generating region and is arranged on the substrate. The second semiconductor layer construction also has said first semiconductor layer sequence, but additionally has a second semiconductor layer sequence, which contains the radiation-absorbing region and is arranged on the first semiconductor layer sequence. The first semiconductor layer sequence is thus present both in the first semiconductor layer construction and in the second semiconductor layer construction. The first semiconductor layer sequence in the first semiconductor layer construction has semiconductor layers having essentially the same composition and the same layer construction as the first semiconductor layer sequence of the second semiconductor layer construction. The first semiconductor layer sequence of both semiconductor layer constructions has usually been produced in the same deposition step.

Preferably, the radiation-generating region and/or the radiation-absorbing region has a quantum well structure.

In a further embodiment, the semiconductor layers of the second semiconductor layer construction that surround the radiation-absorbing region on both sides are formed as mirror layers, preferably as semiconductor mirrors. The mirror layer that is remote from the substrate is preferably partially transmissive and transmits to the greatest possible extent the radiation that is to be detected. Similarly, it is also provided that the semiconductor layers of the first semiconductor layer construction that surround the radiation-generating region on both sides are formed as mirror layers, preferably as semiconductor mirrors. In both cases, the mirror layers are advantageously formed as Bragg mirrors and to a large extent form a resonator.

In a preferred embodiment, the semiconductor component according to the invention has a first contact layer arranged on that side of the substrate which is remote from the semiconductor layers. The first contact layer is preferably provided as a common contact for the emitter and receiver. The substrate is preferably electrically conductive in this case.

A second contact layer is preferably partially arranged on that surface of the first semiconductor layer construction which is remote from the substrate and that of the second semiconductor layer construction.

For the separate driving of the first and second semiconductor layer constructions, preferably an electrically conductive layer is arranged at least on the substrate between the first semiconductor layer construction and the second semiconductor layer construction. Said electrically conductive layer is then electrically connected to the first contact layer. It is furthermore preferred for the electrically conductive layer to be electrically connected to the first semiconductor layer sequence of the second semiconductor layer construction. Consequently, the semiconductor layers that would otherwise form a radiation-generating region in the second semiconductor layer construction are short-circuited and therefore deactivated.

In a further embodiment, the second semiconductor layer construction has a preferably integrated filter layer on the side remote from the substrate. If the semiconductor component receives radiation in the wavelength range between $\lambda_1$ and $\lambda_2$, where $\lambda_2 > \lambda_1$, the filter layer absorbs electromagnetic radiation whose wavelength is less than $\lambda_1$ (short-wave radiation hereinafter) and transmits electromagnetic radiation having a wavelength of greater than $\lambda_1$. As a result, the radiation-absorbing region is not exposed to short-wave radiation. In this case, the radiation-absorbing region detects electromagnetic radiation having a wavelength of less than $\lambda_2$. Only radiation having a wavelength of greater than $\lambda_1$ reaches the radiation-absorbing region, the radiation having a wavelength of greater than $\lambda_2$ not being detected. In this case, the filter layer functions like a cut-off filter which determines the lower limit of the wavelength range to be received. The upper limit of the semiconductor component's range to be received is determined by the radiation-absorbing region. The filter layer is preferably formed from semiconductor layers and preferably has a quantum well structure. Such a filter layer is described in more detail in, U.S. application Ser. No. 10/909,036 filed Jul. 30, 2004, the disclosure content of which is hereby incorporated by reference.

In a preferred embodiment, the semiconductor component contains an electrically insulating passivation layer that partially covers at least the surface of the first semiconductor layer construction that is remote from the substrate and/or the surface of the second semiconductor layer construction that is remote from the substrate. The parts of the surfaces that are not covered with the passivation layer are covered here with the second contact layer.

The first semiconductor layer construction of the semiconductor component preferably forms a laser diode, in particular a VCSEL (Vertical Cavity Surface Emitting Laser), or a plurality of laser diodes or VCSELs.

The second semiconductor layer construction furthermore preferably forms a phototransistor, in particular a resonant cavity phototransistor, or a plurality thereof.

In a further preferred embodiment, the second semiconductor layer construction forms a photodiode, in particular a resonant cavity photodiode, or a plurality thereof.

Another aspect of the present invention is directed to a method for producing an integrated semiconductor component comprising a first semiconductor layer construction for emitting radiation and a second semiconductor layer construction for receiving radiation. Firstly a substrate is provided and a first semiconductor layer sequence containing a radiation-generating region is deposited epitaxially on the substrate. In the same epitaxy step, a second semiconductor layer sequence containing a radiation-absorbing region is subsequently deposited epitaxially on the first semiconductor layer sequence. The second semiconductor layer sequence is then patterned in order to uncover a first location for electrical contact-connection on the surface of the first semiconductor layer sequence that is remote from the substrate and a second location for electrical contact-connection on the surface of the second semiconductor layer sequence that is remote from the substrate. A first semiconductor layer construction, which has the first semiconductor layer sequence and is arranged between the substrate and the first location for contact-connection, is electrically insulated from a second semiconductor layer construction, which has the first and the second semiconductor layer sequence and is arranged between the substrate and the second location for contact-connection. Finally, a first contact layer is applied to the free surface of the substrate and a second contact layer is applied at least to the first and second locations for contact-connection.

In an advantageous embodiment, prior to the application of the contact layers, a passivation layer, which is electrically insulating, is at least partially applied to the free surfaces of the first and second semiconductor layer sequences that are remote from the substrate, the first and second locations for contact-connection being left free in this case. The second contact layer may additionally be partially applied to the passivation layer.

In a further advantageous embodiment, the electrical insulation is carried out by means of implantation or removal of a region lying between the first and second semiconductor layer constructions. Said region may comprise the first semiconductor layer sequence or the first and second semiconductor layer sequences and adjoins at least the substrate. The surfaces of the substrate and of the semiconductor layer sequences that are uncovered by the removal of the region may in each case be completely or partially coated continuously with the second or a third contact layer. It is thus possible to produce an electrical connection between the first and said second/third contact layer.

In a preferred embodiment, a current constriction layer is introduced into the first semiconductor layer sequence of the first semiconductor layer construction between the radiation-generating region and the first location for contact-connection. The current constriction layer serves for increasing the current density in the radiation-generating region and for stimulating the laser activity.

In a particularly preferred embodiment, during the single epitaxy step, a filter layer is additionally deposited epitaxially onto the second semiconductor layer sequence of the second semiconductor layer construction. The filter layer may be formed as a layer sequence.

In a further embodiment, during patterning, the first semiconductor layer construction is patterned in such a way that a mesa structure is formed, the side areas of which project into the first semiconductor layer sequence as far as the semiconductor layers that lie between the substrate and the radiation-generating region, so that the side areas of the mesa structure extend at least beyond the radiation-generating region.

In a further preferred embodiment, during patterning, the second semiconductor layer construction is patterned in such a way that a mesa structure is formed, the side areas of which project into the second semiconductor layer sequence as far as the first semiconductor layer sequence. In this case, the side areas of the mesa structure cut through the radiation-absorbing region.

BRIEF DESCRIPTION OF THE DRAWINGS

Further features, advantages and expediencies of the invention emerge from the exemplary embodiments explained below in conjunction with FIGS. 1 to 5, in which:

FIG. 4 shows a diagram of the indium and aluminium concentrations in the various layers of the semiconductor component from the radiation coupling-in area as far as the substrate, and FIGS. 5a to 5e show a diagrammatic illustration of a method sequence in accordance with the exemplary embodiment relating to the method.

DETAILED DESCRIPTION OF THE DRAWINGS

Identical or identically acting elements are provided with the same reference symbols in the figures. In order to afford a better understanding, in particular the thicknesses of the layers are not illustrated to scale in the figures.

Figure 1:
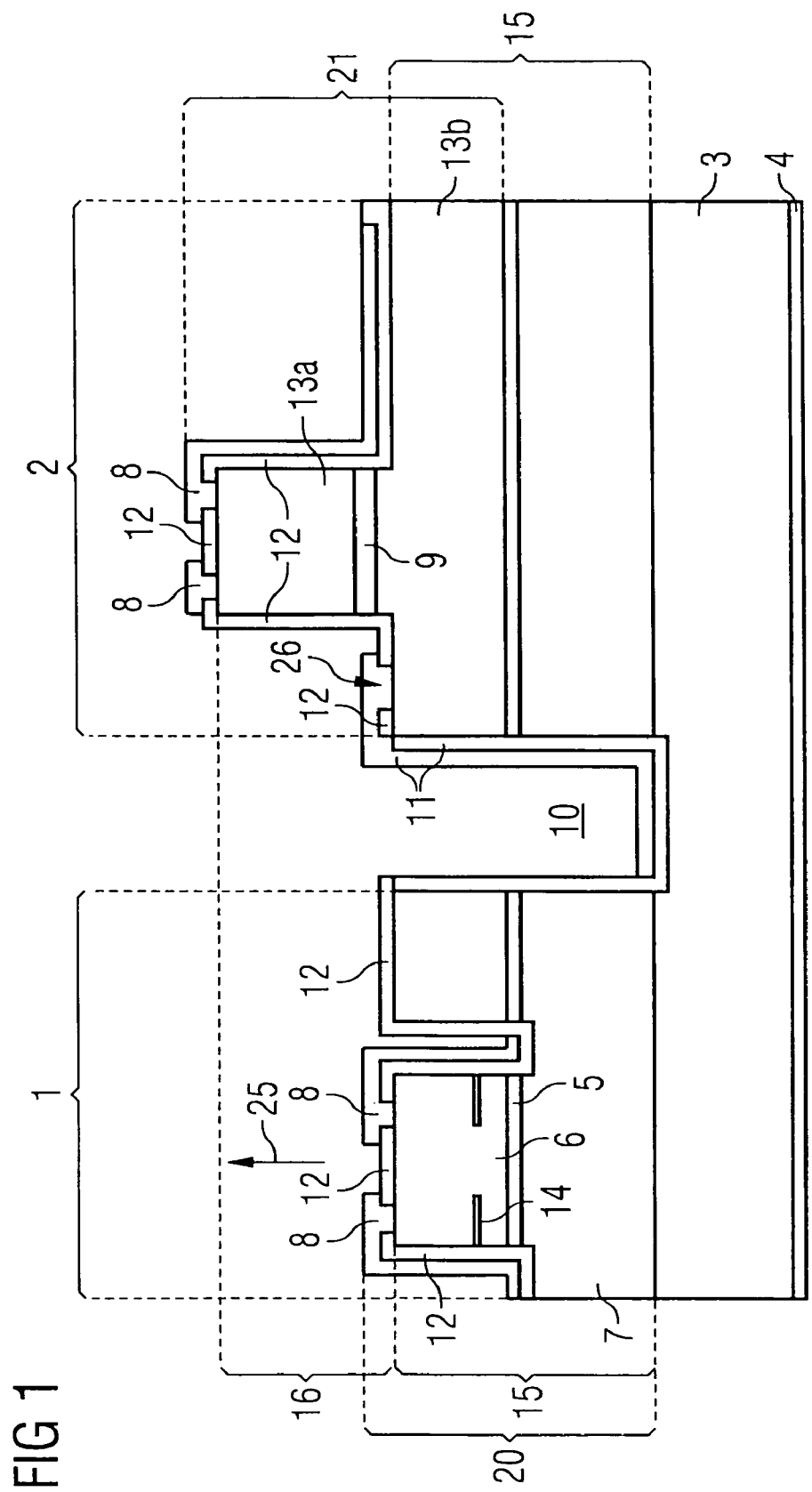
FIG. 1 shows a diagrammatic sectional view of a first exemplary embodiment of a semiconductor component according to the invention.

The semiconductor component illustrated in FIG. 1 has a first semiconductor layer construction 1 and a second semiconductor layer construction 2 which are arranged one beside the other on a common substrate 3. By way of example, the substrate 3 is a GaAs substrate and preferably electrically conductive. A first contact layer 4 is arranged on that side of the substrate 3 which is remote from the semiconductor layers, and contains AuGe, for example. In this case, the first contact layer 4 forms the n-type contact of the semiconductor component and is preferably applied over the whole area.

The first semiconductor layer construction 1 forms an emitter 20 and the second semiconductor layer construction 2 forms a receiver 21. In this example, the emitter 20 is formed as a VCSEL and the receiver 21 is formed as a resonant cavity phototransistor.

The first semiconductor layer construction 1 preferably has a first semiconductor layer sequence 15, which contains a radiation-generating region 5 and is arranged on the substrate 3. The radiation-generating region 5 is arranged between p-conducting semiconductor layers 6 and n-conducting semiconductor layers 7 of the first semiconductor layer construction 1. The radiation-generating region 5 may be formed as a quantum well structure. By way of example, said radiation-generating region 5 comprises three GaAs quantum wells. The p-conducting 6 and n-conducting semiconductor layers 7 may be formed as Bragg mirrors. In this case, the p-conducting 6 and n-conducting semiconductor layers 7 alternatively have $Al_{0.2}Ga_{0.8}As$ and $Al_{0.9}Ga_{0.1}As$ layers with corresponding doping. By way of example, the n-conducting Bragg mirror contains 36 periods and the p-conducting Bragg mirror contains 25 periods.

Optionally, the first semiconductor layer construction 1 has a mesa structure 18a (see FIG. 2), the side areas 19a of which cut at least through the radiation-generating region 5. The side areas 19a preferably extend into the n-conducting semiconductor layers 7. In order to increase the current density, the p-conducting semiconductor layers 6 may have a current constriction layer 14. The current constriction layer 14 preferably lies near the radiation-generating region 5.

Apart from the locations provided for electrical contact-connection and, if appropriate, coupling-out of radiation, the surface of the first semiconductor layer construction that is remote from the substrate is coated with a passivation layer 12. The passivation layer 12 protects the semiconductor surface and may additionally prevent undesirable short circuits. At the top side, a second contact layer 8 is applied for the contact-connection of the p-conducting semiconductor layers 6 of the first semiconductor layer construction, which partially covers the passivation layer 12.

The second semiconductor layer construction 2 likewise has a first semiconductor layer sequence 15 on the substrate 3. The composition of said first semiconductor layer sequence 15 of the second semiconductor layer construction 2 corresponds to the composition of the first semiconductor layer sequence 15 of the first semiconductor layer construction 1, the p-conducting semiconductor layers of the second semiconductor layer construction 2 serving as p-conducting Bragg mirror 13b of the RC phototransistor. A second semiconductor layer sequence 16 containing a radiation-absorbing region 9 and a further p-conducting Bragg mirror 13a lies on said first semiconductor layer sequence 15. In this example, the further p-conducting Bragg mirror 13a has 10 $Al_{0.2}Ga_{0.8}As/Al_{0.9}Ga_{0.1}As$ periods. The p-conducting Bragg mirror 13a is preferably partially transmissive and essentially transmits the radiation to be detected. The radiation-absorbing region 9 is preferably formed as a quantum well structure and has GaAs, for example.

The first semiconductor layer construction 1 and the second semiconductor layer construction 2 are separated from one another by a recess 10, for example. The recess preferably extends as far as the substrate 3. As an alternative, the first semiconductor layer construction 1 and the second semiconductor layer construction 2 may be separated by an electrically insulating region.

The second semiconductor layer sequence 16 is formed for example as a mesa structure 18b, the side areas 19b of which cut through the radiation-absorbing region 9. The side areas 19b preferably extend right into the p-conducting Bragg mirror 13b. Apart from a location 26 provided for electrical contact-connection to the first contact layer 4, and the locations for p-contact-connection of the phototransistor, the surface of the second semiconductor layer construction 2 that is remote from the substrate 3 is coated with a passivation layer 12. The second contact layer 8 is arranged at the locations for p-contact-connection of the transistor. The second contact layer 8 may also partially cover the passivation layer 12.

An electrically conductive layer 11 is applied at the location 26 provided for electrically connecting the first contact layer 4 to the p-conducting Bragg mirror 13b. Said electrically conductive layer 11 extends from said location 26 via the recess 10 at least as far as the substrate 3 and thus connects the p-conducting Bragg mirror 13b to the first contact layer 4.

The electrically conductive layer 11 may be formed as a layer sequence. By way of example, such a layer sequence comprises the first and second contact layer 4, 8. However, it may also comprise a third contact layer or be formed from a third contact layer.

The semiconductor component described above may also be formed in such a way that all the p-conducting semiconductor layers are conversely n-conducting and all the n-conducting semiconductor layers are correspondingly p-conducting. In other words, the semiconductor layers 7 of the first semiconductor layer construction 1 may also be p-conducting and the semiconductor layers 6 may be correspondingly n-conducting. In this case, the first contact layer 4 is consequently the p-type contact and the semiconductor mirrors 13a, 13b of the second semiconductor layer construction 2 are correspondingly n-conducting. The second contact layer 8 thus forms the p-type contact.

Figure 2:
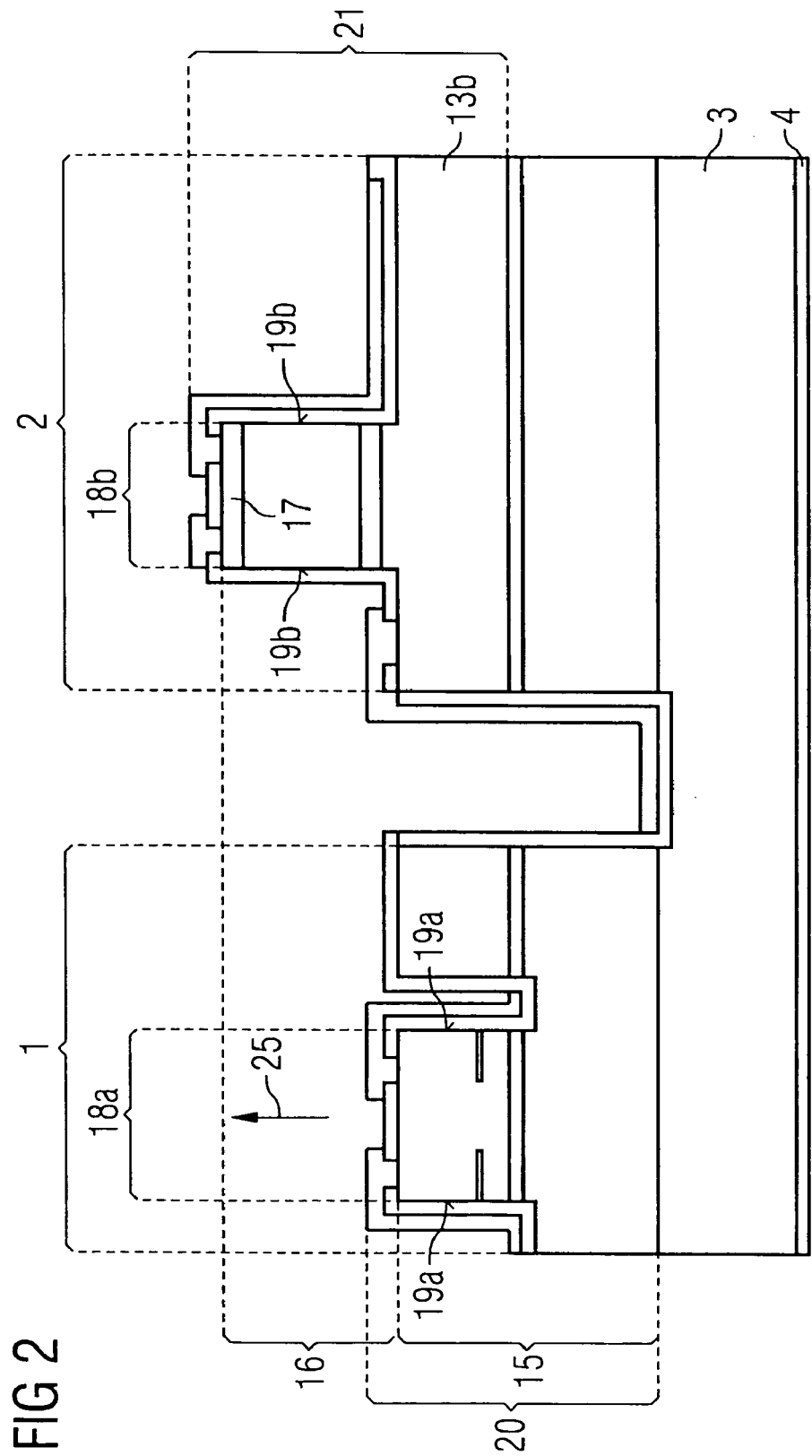
FIG. 2 shows a diagrammatic sectional view of a second exemplary embodiment of a semiconductor component according to the invention.

The semiconductor component illustrated in FIG. 2 differs from the semiconductor component illustrated in FIG. 1 only by an additional filter layer 17 arranged on that surface of the p-conducting Bragg mirror 13a which is remote from the substrate 3. By way of example, the filter layer 17 has $Al_{0.1}Ga_{0.9}As$ and contains a plurality of $In_{0.2}Ga_{0.8}As$ quantum wells. The filter layer 17 serves for absorbing short-wave radiation before it reaches the radiation-absorbing region 9.

Figure 3:
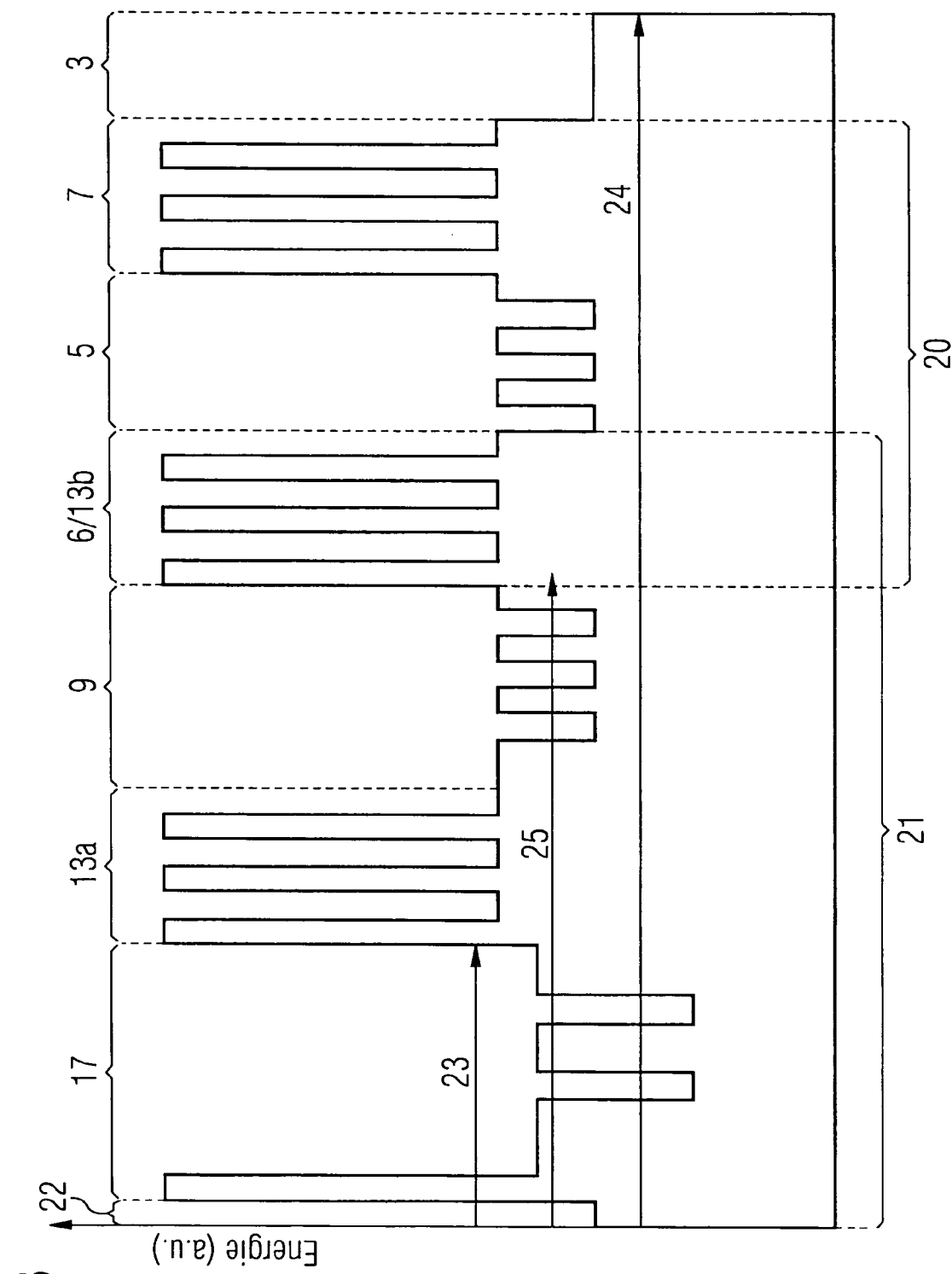
FIG. 3 shows a diagram of the band gaps in the various layers of the semiconductor component from the radiation coupling-in area as far as the substrate.
Figure 5D:
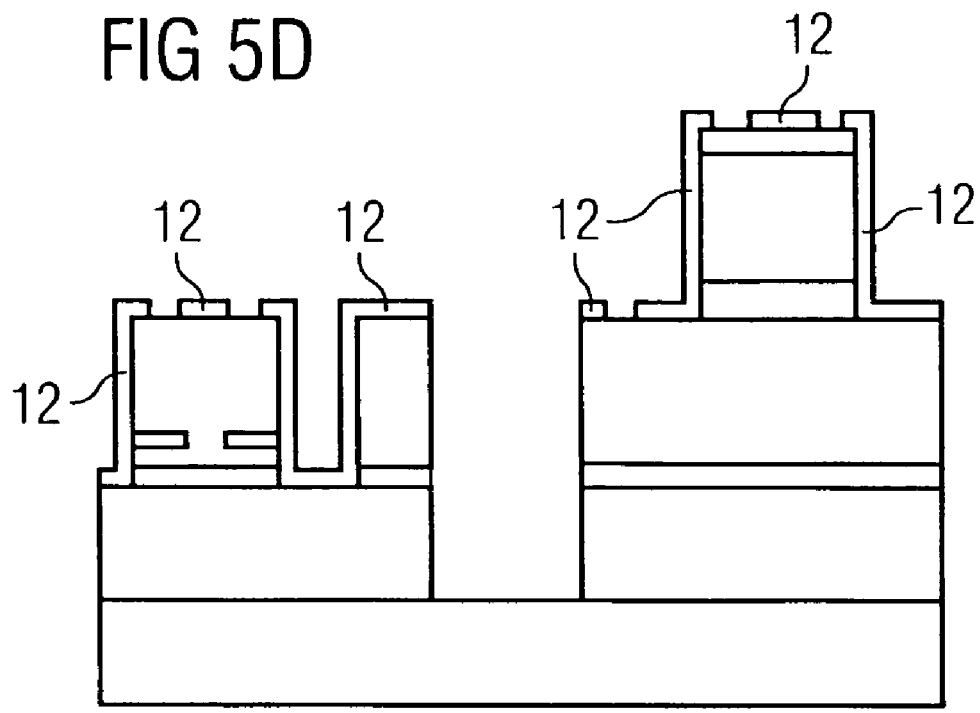
Figure 5E:
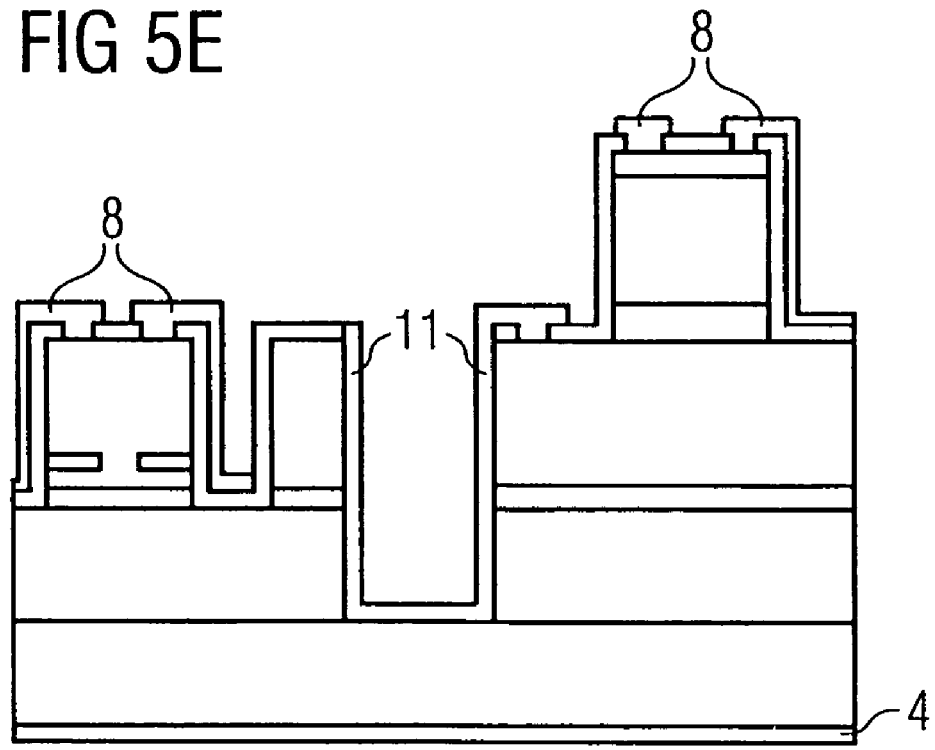

FIG. 3 shows the band gaps of the various layers of the semiconductor component from the filter layer 17 of the receiver 21 as far as the common substrate 3. Band gaps are plotted against the succession of layers illustrated along the horizontal axis.

Apart from a cap layer 22 arranged on the filter layer 17, the construction of the semiconductor component illustrated in FIG. 3 essentially corresponds to that of the exemplary embodiment illustrated in FIG. 2. The cap layer 22 is formed for example from GaAs and in very thin fashion (of the order of magnitude of $10^{-9}$ m). It serves to protect the filter layer 17 from oxidation. The filter layer 17 generally contains relatively high concentrations of aluminum (see FIG. 4) and can readily oxidize in an air environment. The cap layer 22 contains preferably no or hardly any proportions of aluminum and therefore prevents the oxidation of aluminum at the air/semiconductor interface. Such oxidation may lead to the disturbance of the electrical properties of the semiconductor layers.

The arrows 23 symbolically represent short-wave light. Short-wave light is understood here to be electromagnetic radiation whose wavelength is less than the wavelength of the radiation generated by the emitter or the receiver's radiation to be absorbed. Conversely, long-wave light is understood to be electromagnetic radiation whose wavelength is greater than the wavelength of the radiation generated by the emitter or the receiver's radiation to be absorbed. The short-wave light 23 penetrates into the filter layer 17 of the second semiconductor layer construction and is largely absorbed here and converted into long-wave light for example by means of a relaxation process in the quantum well structure present in the filter layer 17. Quantum well structures can be recognized in FIG. 3 by virtue of large vertical band gaps in the filter layer 17, in the radiation-absorbing region 9 and in the radiation-generating region 5.

Long-wave light is represented symbolically by the arrows 24. The long-wave light comprises the light converted by means of the filter layer 17 and also long-wave ambient light and is largely transmitted through the semiconductor layers of the semiconductor component.

The radiation that is generated by the emitter and is to be detected is indicated by the arrows 25. The radiation 25 is largely transmitted through the filter layer 17 and the partially transmissive mirror 13a. The resonant wavelength of the resonator formed by means of the mirrors 13a, 13b essentially corresponds to the wavelength of the radiation 25.

FIG. 4 illustrates by way of example the indium and aluminum concentrations of the layers of a semiconductor component with a profile of the band gap in accordance with FIG. 3. FIG. 4 reveals, in conjunction with FIG. 3, that a higher aluminum concentration corresponds to a higher band gap. Conversely, a higher indium concentration corresponds to a lower band gap.

FIGS. 5a to 5e illustrate five intermediate steps of a method for producing a semiconductor component illustrated in FIG. 2.

A substrate 3 is provided in FIG. 5a. The epitaxial deposition of the first semiconductor layer sequence 15 and of the second semiconductor layer sequence 16 is illustrated in FIG. 5b. Here, the p-conducting semiconductor layers 7, the radiation-generating region 5, the p-conducting semiconductor layers 6 or the p-conducting Bragg mirror 13b, the radiation-absorbing region 9, the p-conducting Bragg mirror 13a and the filter layer 17 are deposited in one epitaxy step. One advantage of the single-step epitaxy is that the epitaxy process is not interrupted, or the deposited semiconductor layer sequence is not taken out of the epitaxy installation in the meantime, which may lead to contaminants in the semiconductor layers. It is thus possible to ensure a high quality of the semiconductor layers.

The semiconductor layers are subsequently patterned. The uncovering of at least one first location for electrical contact-connection on the surface of the first semiconductor layer sequence 15 that is remote from the substrate 3 and at least one side location for electrical contact-connection on the surface of the second semiconductor layer sequence 16 that is remote from the substrate 3 may be carried out by means of photolithography, wet-chemically or dry etching.

Optionally, the uncovered first semiconductor layer sequence 15 and/or the residual second semiconductor layer sequence 16 may be patterned in such a way that a mesa structure 18 is formed. Such a mesa structure 18 preferably has side areas 19 which, in the case of the first semiconductor layer sequence 15, reach at least as far as the n-conducting semiconductor layers 7. In the case of the second semiconductor layer sequence 16, the side areas 19 preferably extend at least as far as the semiconductor mirror 13b.

A mesa structure 18 in the case of the first semiconductor layer sequence 15 is particularly advantageous for the introduction of a current constriction layer 14 by means of lateral oxidation, because the lateral oxidation into the p-conducting semiconductor layers is simplified by the uncovered side area 19 of the mesa structure 18. The current constriction layer 14 may be produced by implantation, oxidation or any known process.

By way of example, the first semiconductor layer construction 1 is electrically insulated from the second semiconductor layer construction 2 by etching a recess 10, which reaches through the semiconductor layers preferably as far as the substrate 3. As an alternative, the electrical insulation may be carried out by producing an electrically insulating region. By way of example, such an electrically insulating region may be formed by means of implantation.

As an alternative, the electrical insulation of the semiconductor layer constructions may be carried out prior to the patterning of the semiconductor layers for the purpose of uncovering the contact locations. The state of the semiconductor layers after patterning and electrical insulation is illustrated in FIG. 5c.

Firstly, a passivation layer 12, which is electrically insulating, may be at least partially applied to the free surfaces of the first 1 and second semiconductor layer constructions 2 that are remote from the substrate 3. In this case, the first and second locations for contact-connection and also a third contact location, which electrically connects the semiconductor mirror 13b of the second semiconductor layer construction 2 to the first contact layer 4, remain free (see FIG. 5d). The passivation layer 12 may be applied with the aid of one or more mask layers and etching.

Finally, the contact layers 8, 4, 11 are correspondingly applied. The first contact layer 4 is preferably applied over the whole area on the surface of the substrate 3 that is remote from the semiconductor layers. The second contact layer 8 is applied at least to the first and second locations for contact-connection. Usually, the second contact layer 8 is also partially applied over the passivation layer 12. The electrically conductive layer 11 may be formed simultaneously during the application of the second contact layer 8. In this case, the electrically conductive layer 11 comprises the same material as the second contact layer 8. The electrically conductive layer 11 covers at least an area that extends continuously from the location for contact-connection to the semiconductor mirror 13b as far as the substrate 3. In order also to short-circuit the parts of the first semiconductor layer construction 1 that have remained from the formation of the mesa structure 18, the side areas of the parts—not belonging to the mesa structure—of the radiation-generating region 5 and of the p-conducting Bragg mirror 6 may also be coated with the electrically conductive layer 11. In the case of the configuration illustrated in FIG. 1, preferably the entire area of the recess 10 is covered.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A radiation-emitting-and-receiving semiconductor component comprising:
    at least a first semiconductor layer construction and a second semiconductor layer construction which are arranged spaced apart from one another in an integrated manner on a common substrate;
    the first semiconductor layer construction having a first semiconductor layer sequence comprising an electromagnetic-radiation-generating region, n-conducting semiconductor layers and p-conducting semiconductor layers;
    said n-conducting semiconductor layers being arranged between the common substrate and the electromagnetic-radiation-generating region and said p-conducting semiconductor layers being arranged on a side of the electromagnetic-radiation-generating region which is remote from the common substrate;
    the second semiconductor layer construction having a first semiconductor layer sequence and a second semiconductor layer sequence;
    the first semiconductor layer sequence of the first semiconductor layer construction corresponding to the first semiconductor layer sequence of the second semiconductor layer construction and having the same composition;
    the second semiconductor layer sequence comprising an electromagnetic-radiation-absorbing region and a stack of p-conducting semiconductor layers; and
    the electromagnetic-radiation-absorbing region being n-conducting and being arranged between said stack of p-conducting semiconductor layers and the p-conducting semiconductor layers of the first semiconductor layer sequence,
    wherein said electromagnetic-radiation-generating region has a composition which is different from that of the electromagnetic-radiation-absorbing region, and
    wherein the electromagnetic-radiation-generating region and the electromagnetic-radiation-absorbing region are electrically connected to a common contact arranged on a part of the electromagnetic-radiation-generating region that faces the common substrate.

2. The semiconductor component according to claim 1, in which the electromagnetic-radiation-absorbing region is tuned to the radiation from the electromagnetic-radiation-generating region.

3. The semiconductor component according to claim 1, in which the first semiconductor layer construction and the second semiconductor layer construction are arranged one beside the other on the common substrate.

4. The semiconductor component according to claim 1, in which the first semiconductor layer construction and the second semiconductor layer construction are spaced apart from one another by an electrically insulating region or a recess.

5. The semiconductor component according to claim 4, in which the electrically insulating region or recess is formed as far as the common substrate.

6. The semiconductor component according to claim 1, in which the common substrate is formed in electrically conductive fashion.

7. The semiconductor component according to claim 6, in which an electrically conductive layer is arranged at least on the common substrate between the first semiconductor layer construction and the second semiconductor layer construction, and is electrically connected by the common substrate to a first contact layer that is electrically connected to the first semiconductor layer sequence on the part of the common substrate.

8. The semiconductor component according to claim 7, in which the electrically conductive layer is formed as a layer sequence.

9. The semiconductor component according to claim 7, in which the electrically conductive layer is electrically connected to the first semiconductor layer sequence of the second semiconductor layer construction.

10. The semiconductor component according to claim 1, in which at least one of the electromagnetic-radiation-generating region and the electromagnetic-radiation-absorbing region has a quantum well structure.

11. The semiconductor component according to claim 1, in which the electromagnetic-radiation-absorbing region is arranged between two mirror layers.

12. The semiconductor component according to claim 1, in which the p-conducting semiconductor layers and the n-conducting semiconductor layers of the first semiconductor layer construction are formed as mirror layers.

13. The semiconductor component according to claim 11, in which the mirror layers are formed as Bragg mirrors.

14. The semiconductor component according to claim 1, in which the first semiconductor layer sequence of the first semiconductor layer construction has a current constriction layer arranged in the semiconductor layers on that side of the electromagnetic-radiation-generating region which is remote from the common substrate.

15. The semiconductor component according to claim 1, in which the second semiconductor layer construction has a filter layer on the side remote from the common substrate.

16. The semiconductor component according to claim 15, in which the filter layer is formed as semiconductor layers.

17. The semiconductor component according to claim 15, which receives radiation in the wavelength range between $\lambda_1$ and $\lambda_2$, where $\lambda_2 \lambda_1$,
in which
the electromagnetic-radiation-absorbing region detects electromagnetic radiation having a wavelength of less than $\lambda_2$,
the filter layer absorbs electromagnetic radiation having a wavelength of less than $\lambda_1$, and
the filter layer transmits electromagnetic radiation having a wavelength of greater than $\lambda_1$.

18. The semiconductor component according to claim 15, in which the filter layer has at least one quantum well structure.

19. The semiconductor component according to claim 15, in which the filter layer converts the radiation absorbed by the filter layer into light having a wavelength of greater than $\lambda_2$.

20. The semiconductor component according to claim 1, in which at least the surface of the first semiconductor layer construction that is remote from the common substrate and/or the surface of the second semiconductor layer construction that is remote from the common substrate is partially covered with an electrically insulating passivation layer, the parts of the surfaces that are not covered with the passivation layer being covered with a second contact layer.

21. The semiconductor component according to claim 1, in which the first semiconductor layer construction forms a laser diode or a plurality of laser diodes.

22. The semiconductor component according to claim 21, in which the laser diode is formed as a VCSEL.

23. The semiconductor component according to claim 1, in which the second semiconductor layer construction forms a phototransistor or a plurality of phototransistors.

24. The semiconductor component according to claim 23, in which the phototransistor is formed as a resonant cavity phototransistor.

25. The semiconductor component according to claim 1, in which the second semiconductor layer construction forms a photodiode or a plurality of photodiodes.

26. The semiconductor component according to claim 25, in which the photodiode is formed as a resonant cavity photodiode.

27. A radiation-emitting-and-receiving semiconductor component comprising:
at least a first semiconductor layer construction and a second semiconductor layer construction which are arranged spaced apart from one another in an integrated manner on a common substrate;
the first semiconductor layer construction having a first semiconductor layer sequence comprising an electromagnetic-radiation-generating region, n-conducting semiconductor layers and p-conducting semiconductor layers;
said p-conducting semiconductor layers being arranged between the common substrate and the electromagnetic-radiation-generating region and said n-conducting semiconductor layers being arranged on a side of the electromagnetic-radiation-generating region which is remote from the common substrate;
the second semiconductor layer construction having a first semiconductor layer sequence and a second semiconductor layer sequence;
the first semiconductor layer sequence of the first semiconductor layer construction corresponding to the first semiconductor layer sequence of the second semiconductor layer construction and having the same composition;
the second semiconductor layer sequence being arranged on the first semiconductor layer sequence of the second semiconductor layer construction;
the second semiconductor layer sequence comprising an electromagnetic-radiation-absorbing region and a stack of n-conducting semiconductor layers; and
the electromagnetic-radiation-absorbing region being p-conducting and being arranged between said stack of n-conducting semiconductor layers and the n-conducting semiconductor layers of the first semiconductor layer sequence,
wherein said electromagnetic-radiation-generating region has a composition which is different from that of the electromagnetic-radiation-absorbing region, and
wherein the electromagnetic-radiation-generating region and the electromagnetic-radiation-absorbing region are electrically connected to a common contact arranged on a part of the electromagnetic-radiation-generating region that faces the common substrate.

28. The semiconductor component according to claim 27, in which the electromagnetic-radiation-absorbing region is tuned to the radiation from the electromagnetic-radiation-generating region.

29. The semiconductor component according to claim 27, in which the first semiconductor layer construction and the second semiconductor layer construction are arranged one beside the other on the common substrate.

30. The semiconductor component according to claim 27, in which an electrically conductive layer is arranged at least on the common substrate between the first semiconductor layer construction and the second semiconductor layer construction, and is electrically connected by the common substrate to a first contact layer that is electrically connected to the first semiconductor layer sequence on the part of the common substrate.

31. The semiconductor component according to claim 27, in which at least one of the electromagnetic-radiation-generating region and the electromagnetic-radiation-absorbing region has a quantum well structure.

32. The semiconductor component according to claim 27, in which the electromagnetic-radiation-absorbing region is arranged between two mirror layers.

33. The semiconductor component according to claim 27, in which the first semiconductor layer sequence of the first semiconductor layer construction has a current constriction layer arranged in the semiconductor layers on that side of the electromagnetic-radiation-generating region which is remote from the common substrate.

34. The semiconductor component according to claim 27, in which the second semiconductor layer construction has a filter layer on the side remote from the common substrate.

35. The semiconductor component according to claim 34, in which the filter layer is formed as semiconductor layers.

36. The semiconductor component according to claim 27, in which the first semiconductor layer construction forms a laser diode or a plurality of laser diodes.

37. The semiconductor component according to claim 27, in which the second semiconductor layer construction forms a phototransistor or a plurality of phototransistors.

38. The semiconductor component according to claim 37, in which the phototransistor is formed as a resonant cavity phototransistor.

* * * * *

UNITED STATES PATENT AND TRADEMARK OFFICE
CERTIFICATE OF CORRECTION

| | | |
|---|---|---|
| PATENT NO. | : 7,335,922 B2 | Page 1 of 1 |
| APPLICATION NO. | : 10/951525 | |
| DATED | : February 26, 2008 | |
| INVENTOR(S) | : Glenn-Yves Plaine et al. | |

It is certified that error appears in the above-identified patent and that said Letters Patent is hereby corrected as shown below:

Column 11, line 22, replace "and $\lambda_2$, where $\lambda_2$ $\lambda_1$," with $\underline{\lambda_2\text{, where }\lambda_2 > \lambda_1}$, Signed and Sealed this Seventh Day of April, 2009

JOHN DOLL
*Acting Director of the United States Patent and Trademark Office*